United States Patent
Gai et al.

(10) Patent No.: US 10,263,052 B2
(45) Date of Patent: Apr. 16, 2019

(54) DISPLAY PANEL, DISPLAY METHOD THEREOF AND MANUFACTURING METHOD THEREOF

(71) Applicant: BOE Technology Group Co., Ltd., Beijing (CN)

(72) Inventors: Cuili Gai, Beijing (CN); Zhongyuan Wu, Beijing (CN); Kun Cao, Beijing (CN); Yicheng Lin, Beijing (CN); Quanhu Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/788,230

(22) Filed: Oct. 19, 2017

(65) Prior Publication Data
US 2018/0286930 A1    Oct. 4, 2018

(30) Foreign Application Priority Data
Mar. 29, 2017  (CN) .......................... 2017 1 0198886

(51) Int. Cl.
| | |
|---|---|
| *H01L 27/32* | (2006.01) |
| *G02F 1/133* | (2006.01) |
| *G02F 1/1343* | (2006.01) |
| *G02F 1/1334* | (2006.01) |
| *G02F 1/137* | (2006.01) |
| *G02F 1/163* | (2006.01) |
| *G02B 27/01* | (2006.01) |
| *G02F 1/153* | (2006.01) |
| *G02F 1/15* | (2019.01) |
| *H01L 51/52* | (2006.01) |
| *H01L 51/56* | (2006.01) |

(52) U.S. Cl.
CPC ...... *H01L 27/3232* (2013.01); *G02B 27/0172* (2013.01); *G02F 1/137* (2013.01); *G02F 1/1334* (2013.01); *G02F 1/13306* (2013.01); *G02F 1/134309* (2013.01); *G02F 1/15* (2013.01); *G02F 1/153* (2013.01); *G02F 1/163* (2013.01); *G02F 2001/134345* (2013.01); *G02F 2201/44* (2013.01); *H01L 27/3244* (2013.01); *H01L 27/3276* (2013.01); *H01L 51/524* (2013.01); *H01L 51/5206* (2013.01); *H01L 51/5234* (2013.01); *H01L 51/56* (2013.01); *H01L 2227/323* (2013.01); *H01L 2251/5315* (2013.01); *H01L 2251/5323* (2013.01)

(58) Field of Classification Search
CPC .................................................. H01L 27/3232
See application file for complete search history.

(56) References Cited

U.S. PATENT DOCUMENTS

| | | | | |
|---|---|---|---|---|
| 2011/0249211 A1* | 10/2011 | Song | ...................... | G02F 1/1334 349/42 |
| 2012/0268696 A1* | 10/2012 | Yim | ......................... | G09G 3/32 349/104 |
| 2013/0314647 A1* | 11/2013 | Yim | .................. | G02F 1/133528 349/69 |

* cited by examiner

*Primary Examiner* — Charles D Garber
*Assistant Examiner* — Alia Sabur
(74) *Attorney, Agent, or Firm* — Banner & Witcoff, Ltd.

(57) ABSTRACT

A display panel, a display method thereof, and a manufacturing method thereof are provided. The display panel includes a plurality of sub-pixel units. Each of the sub-pixel units includes a first display area and a second display area; the first display area includes an active emitting display unit; and the second display area is configured to switch between a transparent state and an opaque state.

15 Claims, 4 Drawing Sheets

1176

DISPLAY PANEL, DISPLAY METHOD THEREOF AND MANUFACTURING METHOD THEREOF

This application claims priority to and the benefit of Chinese Patent Application No. 201710198886.9 filed on Mar. 29, 2017, which application is incorporated herein in its entirety.

TECHNICAL FIELD

The disclosure relates to a display panel, a display method thereof, and a manufacturing method thereof.

BACKGROUND

With the continuous development of display technology, augmented reality (AR) technology has wide application prospect in the fields such as game, medical treatment, shopping and military affairs due to superior human-computer interaction experience. Therefore, more and more manufacturers are committed to research and development of transparent display products and realize the AR technology through transparent screens.

Electrochromic (EC) materials refer to materials of which the optical properties (e.g., light transmittance) have stable and reversible color change under the action of an external electric field. Therefore, the light transmittance of the EC materials may be controlled by control of the electric field.

Polymer dispersed liquid crystal (PDLC) is a material in which a liquid crystal is dispersed in an organic solid polymeric matrix in the form of droplets in micrometers. As an optical axis of a droplet formed by liquid crystal molecules is freely aligned, the refractive index of the droplet is unmatched with the refractive index of the organic solid polymeric matrix, so light is intensely scattered by the droplet when running through the organic solid polymeric matrix, and hence the opaque state is achieved. The application of the electric field may adjust the alignment of the optical axis of the liquid crystal droplet. When the refractive index of both is matched, the transparent state is achieved.

SUMMARY

At least one embodiment of the disclosure provides a display panel, comprising: a plurality of sub-pixel units, wherein each of the sub-pixel units includes a first display area and a second display area; the first display area includes an active emitting display unit; and the second display area is configured to switch between a transparent state and an opaque state.

For example, in the display panel provided by one embodiment of the disclosure, the second display area includes a liquid crystal unit.

For example, in the display panel provided by one embodiment of the disclosure, the first display area also includes the liquid crystal unit; the active emitting display unit has a light emitting side; and the liquid crystal unit is disposed on a side of the active emitting display unit opposite to the light emitting side.

For example, the liquid crystal units of the first display area and the second display area are continuously arranged; and the liquid crystal units of adjacent sub-pixel units are continuously arranged.

For example, the display panel provided by one embodiment of the disclosure comprises: a first base substrate; a second base substrate; a liquid crystal control electrode disposed on the second base substrate; and a liquid crystal layer disposed between the first base substrate and the second base substrate, wherein the liquid crystal control electrode is disposed on a side of the second base substrate close to the liquid crystal layer; the second base substrate, the liquid crystal control electrode, the liquid crystal layer and the first base substrate form the liquid crystal unit; and the active emitting display unit is disposed in the first display area and disposed on a side of the first base substrate away from the liquid crystal layer.

For example, in the display panel provided by one embodiment of the disclosure, the active emitting display unit includes: a thin-film transistor (TFT) layer, an insulating layer, an anode layer, an organic emission layer, a cathode layer and a cover glass layer which are superimposed on the first base substrate in sequence; the cathode layer is a transparent electrode layer; and the insulating layer, the organic emission layer, the cathode layer and the cover glass layer are also disposed in the second display area.

For example, in the display panel provided by one embodiment of the disclosure, the insulating layer, the organic emission layer and the cathode layer each are integrally distributed on the first base substrate.

For example, the display panel provided by one embodiment of the disclosure comprises: a first base substrate; a second base substrate; a liquid crystal control electrode disposed on the second base substrate; and a liquid crystal layer, wherein the liquid crystal control electrode is disposed on a side of the second base substrate close to the liquid crystal layer; and the active emitting display units are disposed on a side of the first base substrate close to the liquid crystal layer.

For example, in the display panel provided by one embodiment of the disclosure, the active emitting display unit includes: a TFT layer, an insulating layer, an anode layer, an organic emission layer, a cathode layer and a cover glass layer which are superimposed on the first base substrate in sequence; the anode layer is a transparent electrode layer; the liquid crystal layer is disposed between the cover glass layer and the second base substrate; the cover glass layer, the liquid crystal layer, the liquid crystal control electrode and the second base substrate form the liquid crystal unit; and the insulating layer, the organic emission layer and the cover glass layer are also disposed in the second display area.

For example, in the display panel provided by one embodiment of the disclosure, the insulating layer and the organic emission layer are integrally distributed on the first base substrate.

For example, in the display panel provided by one embodiment of the disclosure, the liquid crystal control electrode is integrally distributed on the second base substrate.

For example, in the display panel provided by one embodiment of the disclosure, the second display area includes an electrochromic (EC) unit.

For example, in the display panel provided by one embodiment of the disclosure, the first display area also includes the EC unit; the active emitting display unit includes a light emitting side; and the EC unit is disposed on a side of the active emitting display unit opposite to the light emitting side.

For example, in the display panel provided by one embodiment of the disclosure, the EC units of the first display area and the second display area are continuously arranged; and the EC units of adjacent sub-pixel units are continuously arranged.

At least one embodiment of the disclosure provides a display method of a display panel, wherein the display panel includes the display panel according to claim 1; and the display method comprises: controlling the second display area to be in a transparent state, and controlling the active emitting display unit to perform first-mode display; or controlling the second display area to be in opaque state, and controlling the active emitting display unit to perform second-mode display.

At least one embodiment of the disclosure provides a method for manufacturing a display panel, comprising: dividing each sub-pixel unit in a plurality of sub-pixel units into a first display area and a second display area; and forming an active emitting display unit in the first display area, and configuring the second display area as being switchable between a transparent state and an opaque state.

For example, in the method for manufacturing the display panel provided by one embodiment of the disclosure, configuring the second display area as being switchable between the transparent state and the opaque state includes: forming a liquid crystal unit in the first display area and the second display area, wherein the active emitting display unit has a light emitting side; and the liquid crystal unit is disposed on a side of the active emitting display unit opposite to the light emitting side in the first display area.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise specified, the technical terms or scientific terms used in the disclosure shall have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly.

Currently, the conventional transparent display device is integrally implemented by a liquid crystal display (LCD) panel. However, the inventor of the application has noticed that: as the LCD panel belongs to a passive display panel, the LCD panel cannot emit light and mainly relies on a backlight to provide backlight for display; and when the transparent LCD panel is applied to a transparent display device, the LCD panel can only adopt natural light as the backlight, so the contrast is low, and hence the human-computer interaction experience is poor and the LCD panel cannot be widely applied.

Embodiments of the disclosure provide a display panel, a display method thereof, a manufacturing method thereof and a display device. The display panel comprises a plurality of sub-pixel units. Each sub-pixel unit includes a first display area and a second display area; the first display area includes an active emitting display unit; and the second display area may switch between transparent state and opaque state. The display panel not only provides a novel transparent display panel but also can switch between transparent display and normal display, and hence can realize more functions and have richer applications. In addition, as the display panel adopts the active emitting display units, the display panel has high contrast in the case of transparent display.

Description will be given below to the display panel, the display method thereof, the manufacturing method thereof and the display device, provided by the embodiment of the disclosure, with reference to the accompanying drawings.

First Embodiment

Figure 1A:
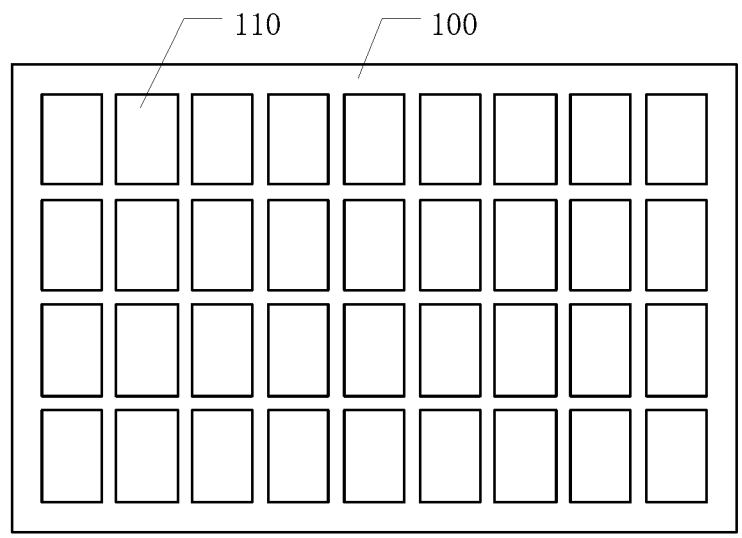
FIG. 1a is a schematic plan view of a display panel provided by one embodiment of the disclosure.
Figure 1B:
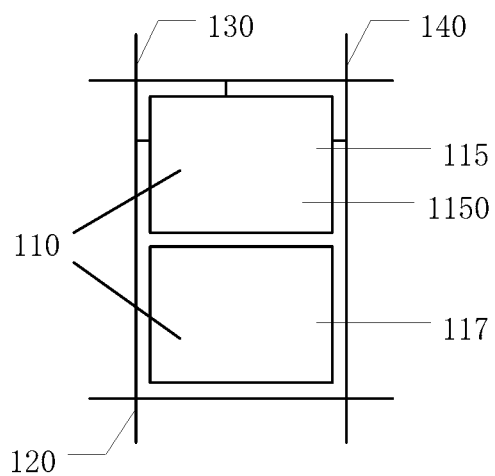
FIG. 1b is a schematic plan view of a sub-pixel unit in the display panel provided by one embodiment of the disclosure.

The embodiment provides a display panel. As illustrated in FIG. 1a, the display panel 100 comprises a plurality of sub-pixel units 110. The plurality of sub-pixel units 100 may display an image together. FIG. 1b is a schematic plan view of one sub-pixel unit 110 in FIG. 1a. As illustrated in FIG. 1b, each sub-pixel unit 110 includes a first display area 115 and a second display area 117; the first display area 115 includes an active emitting display unit 1150; and the second display area 117 may switch between a transparent state and an opaque state.

In the display panel provided by the embodiment, as the first display area includes the active emitting display unit, the first display areas of the plurality of sub-pixel units can display an image and have high contrast. When the second display area is in transparent state, the second display areas of the plurality of sub-pixel units can transmit the light behind the display panel and display a real scene or object behind the display panel, and hence can display together with the first display areas to realize transparent display or augmented reality (AR). When the second display area is in the opaque state, the second display areas of the plurality of sub-pixel units do not affect the normal display of the first display areas and hence can realize normal display. Thus, the display panel not only provides a novel transparent display panel but also can switch between transparent display and normal display, and hence can realize more functions and have richer applications. In addition, as the display panel adopts the active emitting display units, the display panel has high contrast in the case of transparent display or when applied to AR.

For example, when the display panel provided by the embodiment is applied to AR, a user may directly operate an object displayed on the display panel by hand through the display panel. For example, when the user purchases a watch online, the user may place the hand behind the display panel, so a watch displayed on the display panel can be directly "worn" on the wrist, so as to provide a good interactive experience. Moreover, for example, the display panel provided by the embodiment may also be applied in shop windows of shopping plazas, so consumers not only can see a commodity entity but also can see relevant information of the commodity through the display panel, and the display panel can provide various functions. Moreover, the display panel provided by the embodiment can also be used in military fields such as military helmet display.

For example, as illustrated in FIG. 1a, in the display panel provided by the embodiment, the plurality of sub-pixel units may be arranged in an array. However, the embodiment of the disclosure includes but not limited thereto.

For example, as illustrated in FIG. 1b, the display panel provided by the embodiment may further comprise gate lines 120, data lines 130 and power lines 140 which are intersected to define a plurality of sub-pixel units 110, and the plurality of sub-pixel units 110 are driven to display. However, the display panel may also not comprise the power lines. The embodiment includes but not limited thereto.

Figure 2A:
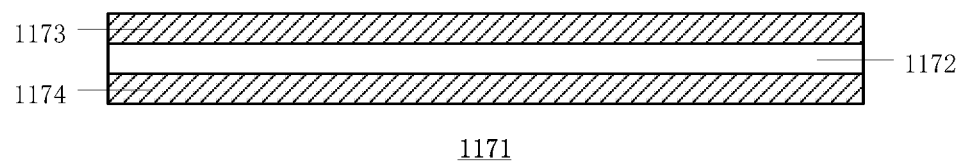
FIG. 2a is a schematic structural view of an electrochromic (EC) unit in the display panel provided by one embodiment of the disclosure.

For example, in the display panel provided by one example of the embodiment, the second display area may include an EC unit and hence can switch between the transparent state and the opaque state. For example, FIG. 2a illustrates an EC unit. As illustrated in FIG. 2a, an EC unit 1171 may include an EC material layer 1172 and a first electrode layer 1173 and a second electrode layer 1174 disposed on both sides of the EC material layer 1172. The EC material layer 1172 may be controlled to switch between the transparent state and the opaque state by the electric filed applied to the first electrode layer 1173 and the second electrode layer 1174. For example, the EC material layer may include inorganic EC materials and/or organic EC materials. The inorganic EC materials may include tungsten trioxide, etc. The organic EC materials may include polythiophenes and derivatives thereof, viologen, tetrathiafulvalene, metal phthalocyanine compounds, etc. The second display area in the embodiment of the disclosure may also adopt other structures capable of switching between the transparent state and the opaque state.

Figure 2B:
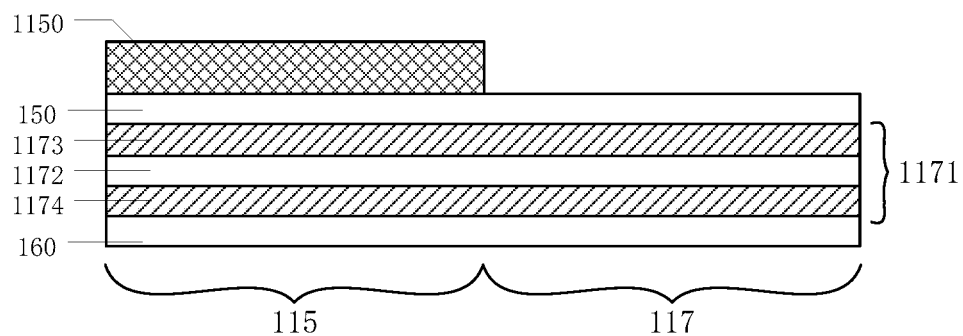
FIG. 2b is a schematic sectional view of the display panel provided by one embodiment of the disclosure.

For example, FIG. 2b is a schematic sectional view of a display panel provided by the embodiment. In order to clearly show the structure of the display panel, FIG. 2b only illustrates the section of one sub-pixel unit in the display panel. As illustrated in FIG. 2b, in the display panel provided by one example of the embodiment, the first display area 115 may also include the EC unit 1171, namely the EC unit 1171 may be simultaneously disposed in the first display area 115 and the second display area 117; the active emitting display unit 1150 has a light emitting side 1151; and the EC unit 1171 is disposed on a side of the active emitting display unit 1150 opposite to the light emitting side 1151. Thus, on one hand, in the process of manufacturing the display panel, the EC unit 1171 may be simultaneously formed in the first display area 115 and the second display area 117, and additional patterning process or other processes for removing the EC units 1171 formed in the first display areas 1150 may be not required, so the manufacturing process can be reduced and the cost can be saved. On the other hand, as the EC unit 1171 is disposed on the side of the active emitting display unit 1150 opposite to the light emitting side 1151, the state (transparent state and opaque state) of the EC unit 1171 will not affect the emission of the active emitting display unit 1150.

For example, the liquid crystal units of the first display area and the second display area are continuously arranged, and the liquid crystal units of adjacent sub-pixel units are continuously arranged.

For example, as illustrated in FIG. 2b, the display panel 100 may further comprise: a first base substrate 150 and a second base substrate 160 which are arranged opposite to each other. The EC 1171 may be disposed on a side of the second base substrate 160 close to the first base substrate 150. The active emitting display unit 1150 may be disposed on a side of the first base substrate 150 away from the second base substrate 160 and disposed in the first display area 115.

For example, the first base substrate and the second base substrate may be a transparent substrate or an opaque substrate. No limitation will be given here in the embodiment of the disclosure.

For example, in the display substrate provided by one example of the embodiment, the second display area may also include the liquid crystal unit.

Figure 3A:
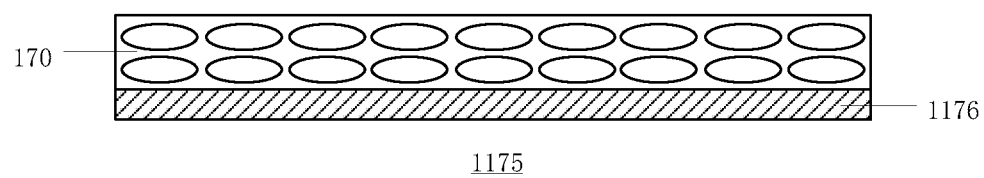
FIG. 3a is a schematic structural view of a liquid crystal unit in the display panel provided by one embodiment of the disclosure.

For example, in the display panel provided by one example of the embodiment, the second display area may include the liquid crystal unit and hence can switch between the transparent state and the opaque state. For example, FIG. 3a illustrates a liquid crystal unit. As illustrated in FIG. 3a, the liquid crystal unit 1175 may include a liquid crystal layer 170 and a liquid crystal control electrode 1176 disposed on a side of the liquid crystal layer 170. The liquid crystal layer 170 may be controlled to switch between the transparent state and the opaque state by the application of an electric field through the liquid crystal control electrode 1176. For example, the liquid crystal layer 170 may include polymer dispersed liquid crystals. It should be noted that the liquid crystal control electrode may be disposed on one side of the liquid crystal layer and may also be disposed on both sides of the liquid crystal layer, as long as the liquid crystal control electrode can control the state (the transparent state and the opaque state) of the liquid crystal layer. No limitation will be given here in the embodiment. In addition, the liquid crystal unit may generally include substrates (not illustrated in the figure) disposed on both sides of the liquid crystal layer and the liquid crystal control electrode. Moreover, the liquid crystal layer may also adopt common liquid crystals, as long as a polarizer is bonded to both sides of the liquid crystal unit, which may specifically refer to the prior art. No limitation will be given here in the embodiment of the disclosure.

Figure 3B:
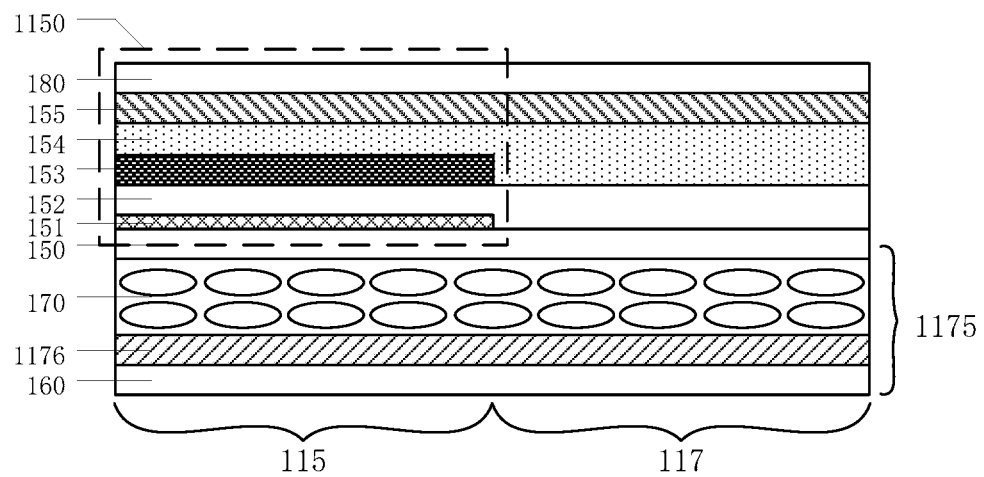
FIG. 3b is a schematic sectional view of another display panel provided by one embodiment of the disclosure.

For example, FIG. 3b is a schematic sectional view of another display panel provided by the embodiment. For clear description of the structure of the display panel, FIG.

3b only illustrates the section of one sub-pixel unit in the display panel. As illustrated in FIG. 3b, in the display panel provided by one example of the embodiment, the first display area 115 may also include the liquid crystal unit 1172, namely the liquid crystal unit 1172 may be simultaneously disposed in the first display area 115 and the second display area 117; the active emitting display unit 1150 has a light emitting side 1151; and the liquid crystal unit 1172 is disposed on a side of the active emitting display unit 1150 opposite to the light emitting side 1151. Thus, on one hand, in the process of manufacturing the display panel, the liquid crystal unit 1172 may be simultaneously formed in the first display area 115 and the second display area 117, so the cell-assembly process can be conveniently achieved and the patterning process can be reduced. Thus, the process can be simplified; the manufacturing process can be reduced; and the cost can be saved. On the other hand, as the liquid crystal unit 1172 is disposed on the side of the active emitting display unit 1150 opposite to the light emitting side 1151, the state (the transparent state and the opaque state) of the liquid crystal unit 1172 will not affect the emission of the active emitting display unit 1150.

For example, the liquid crystal units of the first display area and the second display area are continuously arranged, and the liquid crystal units of adjacent sub-pixel units are continuously arranged.

For example, as illustrated in FIG. 3b, the display panel further comprises a first base substrate 150, a second base substrate 160, a liquid crystal control electrode 1176 and a liquid crystal layer 170. The liquid crystal layer 170 is disposed between the first base substrate 150 and the second base substrate 160. The liquid crystal control electrode 1176 is disposed on the side of the second base substrate 160 close to the liquid crystal layer 170. The second base substrate 160, the liquid crystal control electrode 1176, the liquid crystal layer 170 and the first base substrate 150 form a liquid crystal unit 1175. The active emitting display unit 1150 is disposed in the first display area 115 and disposed on a side of the first base substrate 150 away from the liquid crystal layer 170.

Figure 3C:
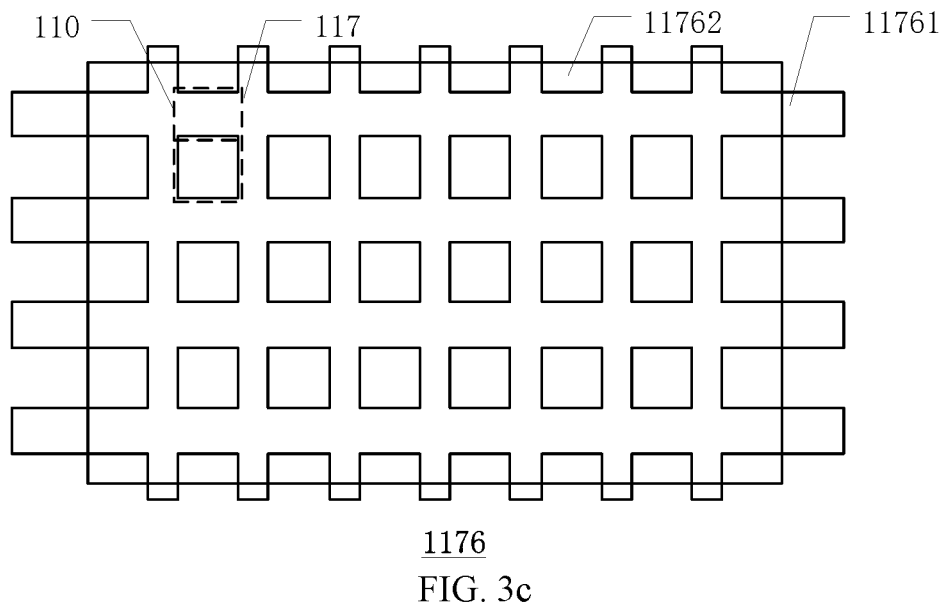
FIG. 3c is a schematic structural view of a liquid crystal control electrode in the display panel provided by one embodiment of the disclosure.

For example, in the display panel provided by one example of the embodiment, the liquid crystal control electrode may be an integral transparent conductive electrode. Of course, the embodiment of the disclosure includes but not limited thereto. When the display panel has large size, as illustrated in FIG. 3c, the liquid crystal control electrode 1176 may include a metal wiring layer 11761 and a transparent electrode layer 11762, so as to reduce the resistance of the liquid crystal control electrode 1176. For example, the metal wiring 11761 may be disposed in the first display area 115, so as to avoid the metal wiring 11761 from affecting the transparent state of the second display area 117. Therefore, the display panel may also be applied to a large-size display device, e.g., a show window.

For example, in the display panel provided by one example of the embodiment, the active emitting display unit may be an organic light-emitting diode (OLED) display unit. As illustrated in FIG. 3b, in the first display area 115, the active emitting display unit 1150 includes a TFT layer 151, an insulating layer 152, an anode layer 153, an organic emission layer 154, a cathode layer 155 and a cover glass layer 180 which are superimposed on the first base substrate 150 in sequence. The TFT layer 151 (namely a drive circuit layer) may be used for driving the active emitting display unit 1150 to emit light so as to achieve display, for example, controlling the switching, the grayscale and the like of the active emitting display unit 1150. For example, the cathode layer 155 is a transparent electrode layer, so the active emitting display unit 1150 is a top-emitting OLED display unit. As the insulating layer 152, the organic emission layer 154, the cathode layer 155 and the cover glass layer 180 may be transparent layers, the insulating layer 152, the organic emission layer 154, the cathode layer 155 and the cover glass layer 180 may also be disposed in the second display area 117. Thus, the patterning processes of the above layers can be reduced, and the height difference between the first display area 115 and the second display area 117 can be also reduced.

For example, the TFT layer may adopt a 2T1C (two TFTs and one capacitor) structure, which may specifically refer to the prior art. Of course, the embodiment of the disclosure includes but not limited thereto.

For example, the material of the anode layer may be opaque metal such as aluminum.

For example, in the display panel provided by one example of the embodiment, as illustrated in FIG. 3b, the insulating layer 152, the organic emission layer 154 and the cathode layer 155 are integrally distributed on the first base substrate 150. Thus, the insulating layer 152, the organic emission layer 154 and the cathode layer 155 may not require an additional patterning process, so the process can be saved and the cost can be reduced.

For example, in the display panel provided by one example of the embodiment, as illustrated in FIG. 3b, the liquid crystal control electrode 1176 may be integrally distributed on the second base substrate 160. Thus, the liquid crystal control electrode 1176 may not require an additional patterning process, so the process can be saved and the cost can be reduced.

Figure 4:
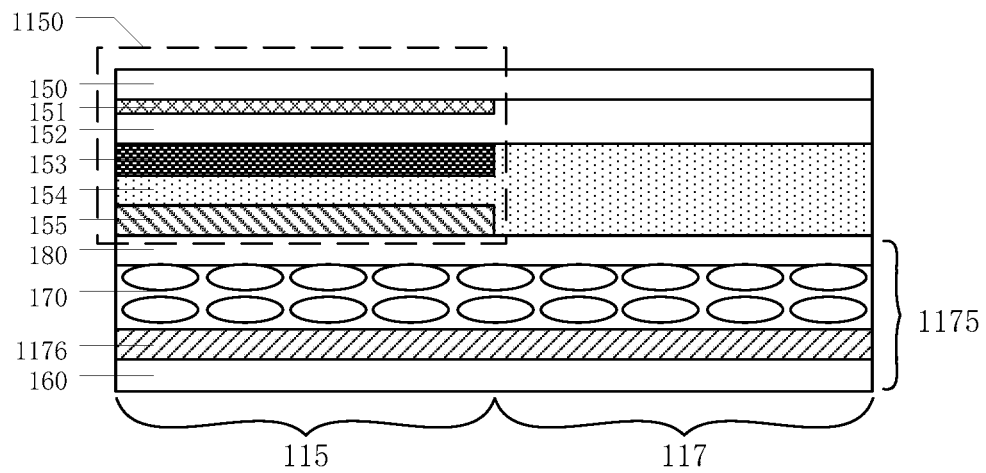
FIG. 4 is a schematic sectional view of another display panel provided by one embodiment of the disclosure.

For example, FIG. 4 is a schematic sectional view of another display panel provided by the embodiment. In order to clearly show the structure of the display panel, FIG. 4 only illustrates the section of one sub-pixel unit in the display panel. As illustrated in FIG. 4, the display panel comprises a first base substrate 150, a second base substrate 160, a liquid crystal control electrode 1176 and a liquid crystal layer 170. The liquid crystal control electrode 1176 is disposed on a side of the second base substrate 160 close to the liquid crystal layer 170. The active emitting display unit 1150 is disposed on a side of the first base substrate 150 close to the liquid crystal layer 170.

For example, in the display panel provided by one example of the embodiment, the active emitting display unit may be a bottom-emitting OLED display unit. As illustrated in FIG. 4, in the first display area 115, the active emitting display unit 1150 includes a TFT layer 151, an insulating layer 152, an anode layer 153, an organic emission layer 154, a cathode layer 155 and a cover glass layer 180 which are superimposed on the first base substrate 150 in sequence. The anode layer 153 is a transparent electrode layer. The liquid crystal layer 170 is disposed between the cover glass layer 180 and the second base substrate 160. At this point, the cover glass layer 180, the liquid crystal layer 170, the liquid crystal control electrode 1176 and the second base substrate 160 form a liquid crystal unit 1175. As the insulating layer 152, the organic emission layer 154 and the cover glass layer 180 are transparent layers, the insulating layer 152, the organic emission layer 154 and the cover glass layer 180 may be also disposed in the second display area 117. Thus, the processes of patterning the above layers can be reduced, and the height difference between the first display area 115 and the second display area 117 can be also reduced.

For example, in the display panel provided by one example of the embodiment, as illustrated in FIG. 4, the insulating layer 152 and the organic emission layer 154 may be integrally distributed on the first base substrate 150. Thus, the insulating layer 152 and the organic emission layer 154 may not require an additional patterning process, so the process can be saved and the cost can be reduced.

For example, in the display panel provided by one example of the embodiment, as illustrated in FIG. 4, the liquid crystal control electrode 1176 may be integrally distributed on the second base substrate 160. Thus, the liquid crystal control electrode 1176 may not require an additional patterning process, so the process can be saved and the cost can be reduced.

Second Embodiment

The embodiment provides a display device, which comprises the display panel provided by any example of the first embodiment. Thus, the display device not only can provide a novel transparent display device but also can switch between transparent display and normal display, and hence can realize more functions and have richer applications. In addition, as the display device adopts the active emitting display units, in the case of transparent display or when applied to AR, the display panel has high contrast, and the specific effect may refer to relevant description in the first embodiment. Moreover, as the display device comprises the display panel provided by any example of the first embodiment, the display device also has the technical effects corresponding to the advantages of the display panel, which may specifically refer to relevant description in the first embodiment. No further description will be given here in the embodiment of the disclosure.

Third Embodiment

Figure 5A:
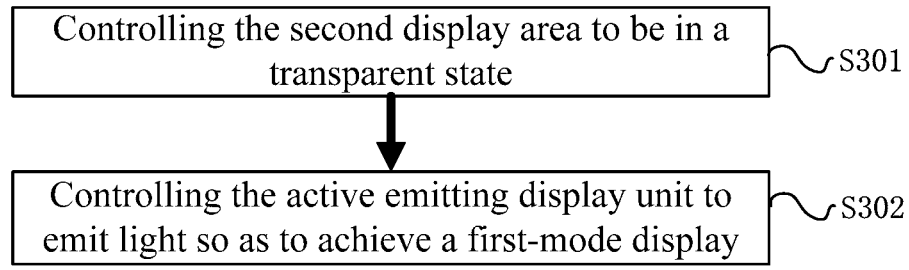
FIG. 5a is a flow diagram of a display method of the display panel, provided by one embodiment of the disclosure.
Figure 5B:
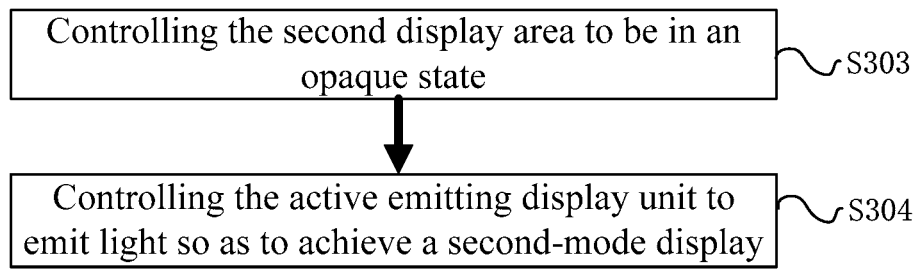
FIG. 5b is a flow diagram of another display method of the display panel, provided by one embodiment of the disclosure.

The embodiment provides a display method of a display panel. The display panel may adopt the display panel provided by any example of the first embodiment. The specific structure may refer to relevant description in the first embodiment. FIGS. 5a and 5b are flow diagrams of the display method of the display panel, provided by the embodiment. As illustrated in FIG. 5a, the display method of the display panel comprises the steps S301 and S302. Or as illustrated in FIG. 5b, the display method of the display panel comprises the steps S303 and S304.

S301: controlling the second display area to be in transparent state.

For example, when the second display area includes the EC unit, the EC material layer is controlled to be in transparent state through the first electrode layer and the second electrode layer; and when the second display area includes the liquid crystal unit, the liquid crystal layer is controlled to be in transparent state through the liquid crystal control electrode.

S302: controlling the active emitting display unit to emit light so as to achieve first-mode display.

For example, the first-mode display refers to transparent display or display for realizing AR. That is to say, the user can simultaneously view a real scene or object behind the display panel and an image on the display panel, so transparent display or AR can be realized.

S303: controlling the second display area to be in opaque state.

For example, when the second display area includes the EC unit, the EC material layer is controlled to be in opaque state through the first electrode layer and the second electrode layer; and when the second display area includes the liquid crystal unit, the liquid crystal layer is controlled to be in opaque state through the liquid crystal control electrode.

S304: controlling the active emitting display unit to emit light so as to achieve second-mode display.

For example, the second-mode display refers to normal display. That is to say, the user can only view an image displayed by the active emitting display units on the display panel.

The display method of the display panel, provided by the embodiment, not only can provide a transparent display method but also can switch between transparent display and normal display, and hence can realize more functions and have richer applications.

Fourth Embodiment

Figure 6:
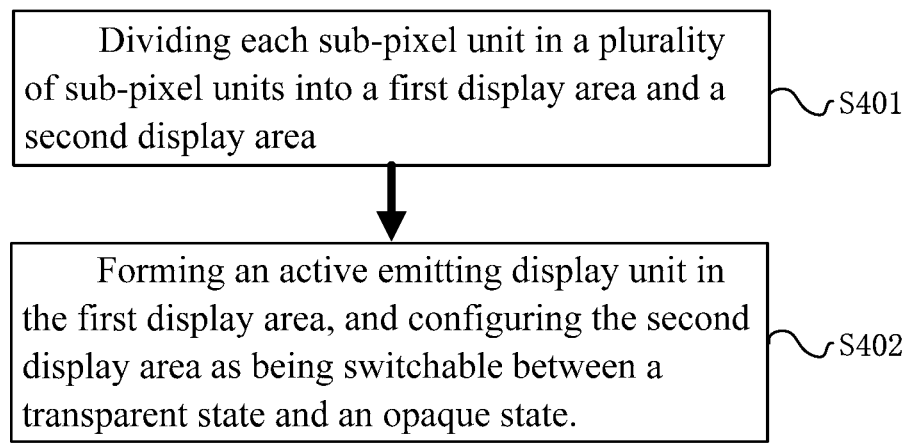
FIG. 6 is a flow diagram of a method for manufacturing a display panel, provided by one embodiment of the disclosure.

The embodiment provides a method for manufacturing a display panel. FIG. 6 shows the method for manufacturing the display panel, provided by the embodiment. As illustrated in FIG. 6, the method for manufacturing the display panel comprises the steps S401 and S402.

S401: dividing each sub-pixel unit in a plurality of sub-pixel units into a first display area and a second display area.

S402: forming an active emitting display unit in the first display area, and configuring the second display area as being switchable between a transparent state and an opaque state, so as to form the plurality of sub-pixel units.

Thus, the method for manufacturing the display panel not only can provide a novel method for manufacturing the display panel but also allows the display panel to realize more functions and have richer applications. In addition, as the display panel adopts the active emitting display units, in the case of transparent display or when applied to AR, the display panel has high contrast. The specific effects may refer to relevant description in the first embodiment.

For example, the method for manufacturing the display panel, provided by one example of the embodiment, further comprises: forming a liquid crystal unit in a first display area and a second display area. The active emitting display unit has a light emitting side. In the first display area, the liquid crystal unit is formed on a side of the active emitting display unit opposite to the light emitting side. Thus, on one hand, in the process of manufacturing the display panel, the liquid crystal unit may be simultaneously formed in the first display area and the second display area, and an additional patterning process or other processes for removing various layers in the liquid crystal unit formed in the first display area are not required. Thus, the manufacturing process can be reduced, and the cost can be saved. Moreover, as the liquid crystal unit is formed in the first display area and the second display area, cell-assembly process can be also conveniently achieved. On the other hand, as the liquid crystal unit is disposed on a side of the active emitting display unit opposite to the light emitting side, the state (transparent state and opaque state) of the liquid crystal unit will not affect the emission of the active emitting display unit. It should be noted that: similarly, the EC unit may also be formed in the first display area and the second display area. No further description will be given here in the embodiment of the disclosure.

For example, the method for manufacturing the display panel, provided by one example of the embodiment, may further comprise: providing a first base substrate and a second base substrate. The step S402 may include: forming active emitting display units on the first base substrate, which can be referred to as a first substrate; forming a liquid crystal control electrode on the second base substrate, which can be referred to as a second substrate; and cell-assembling the two substrates, namely the first substrate and the second substrate. For example, at this point, the active emitting display unit may be disposed on a side of the first base substrate away from the second base substrate, and the liquid crystal control electrode may be disposed on a side of the second base substrate close to the first base substrate; and liquid crystals are filled between the first base substrate and the second base substrate to form a liquid crystal layer.

For example, in the method for manufacturing the display panel, provided by one example of the embodiment, the active emitting display unit may be a top-emitting OLED display unit. The step of forming the active emitting display unit on the first base substrate may include: forming a TFT layer, an insulating layer, an anode layer, an organic emission layer, a cathode layer and a cover glass layer on the first base substrate in sequence. The cathode layer is a transparent electrode layer. As the insulating layer, the organic emission layer, the cathode layer and the cover glass layer may be transparent layers, the insulating layer, the organic emission layer, the cathode layer and the cover glass layer may be also simultaneously formed at positions of the first base substrate corresponding to the second display areas. Thus, the processes of patterning the above layers can be reduced, and the height difference between the first display area and the second display area can be also reduced.

For example, the organic emission layer and the cathode layer may be formed by evaporation process. The insulating layer may be formed by coating process or deposition process.

For example, the method for manufacturing the display panel, provided by one example of the embodiment, may further comprise the step of bonding a polarizer. No further description will be given here in the embodiment of the disclosure.

For example, in the method for manufacturing the display panel, provided by one example of the embodiment, the active emitting display unit may be a bottom-emitting OLED display unit. The step of forming the active emitting display unit on the first base substrate may include: forming a TFT layer, an insulating layer, an anode layer, an organic emission layer, a cathode layer and a cover glass layer on the first base substrate in sequence. The anode layer is a transparent electrode layer. As the insulating layer, the organic emission layer and the cover glass layer may be also disposed in the second display area, the processes of patterning the above layers are reduced, and the height difference between the first display area and the second display area is also reduced.

The following points should be noted:

(1) Only the structures relevant to the embodiments of the present invention are involved in the accompanying drawings of the embodiments of the present invention, and other structures may refer to the conventional design.

(2) The embodiments of the present invention and the characteristics in the embodiments may be mutually combined without conflict.

The foregoing is merely exemplary embodiments of the invention, but is not used to limit the protection scope of the invention. The protection scope of the invention shall be defined by the attached claims.

The application claims priority to the Chinese Patent Application No. 201710198886.9, filed Mar. 29, 2017, the entire disclosure of which is incorporated herein by reference as part of the present application.

The invention claimed is:

1. A display panel, comprising:
a plurality of sub-pixel units, wherein each of the sub-pixel units includes a first display area and a second display area, the first display area includes an active emitting display unit, the second display area is configured to switch between a transparent state and an opaque state, the second display area includes a liquid crystal unit, and the first display area also includes the liquid crystal unit, the active emitting display unit has a light emitting side;
a first base substrate;
a second base substrate;
a liquid crystal control electrode disposed on the second base substrate; and
a liquid crystal layer disposed between the first base substrate and the second base substrate, wherein the liquid crystal control electrode is disposed on a side of the second base substrate close to the liquid crystal layer,
wherein the active emitting display unit includes a thin-film transistor (TFT) layer, an insulating layer, an anode layer, an organic emission layer, a cathode layer and a cover glass layer which are superimposed on the first base substrate in sequence, the cathode layer is a transparent electrode layer; the insulating layer, the organic emission layer, and the cover glass layer are also disposed in the second display area; and the insulating layer and the organic emission layer each are distributed on the entire first base substrate.

2. The display panel according to claim 1, wherein the liquid crystal unit is disposed on a side of the active emitting display unit opposite to the light emitting side.

3. The display panel according to claim 2, wherein the liquid crystal unit of the first display area and the liquid crystal unit of the second display area are continuously arranged; and liquid crystal units of adjacent sub-pixel units are continuously arranged.

4. The display panel according to claim 2, wherein the second base substrate, the liquid crystal control electrode, the liquid crystal layer, and the first base substrate form the liquid crystal unit; and the active emitting display unit is disposed in the first display area and disposed on a side of the first base substrate away from the liquid crystal layer.

5. The display panel according to claim 4, wherein the cathode layer is also disposed in the second display area.

6. The display panel according to claim 5, wherein the cathode layer each is integrally distributed on the first base substrate.

7. The display panel according to claim 2, wherein the active emitting display unit is disposed on a side of the first base substrate close to the liquid crystal layer.

8. The display panel according to claim 7, wherein the anode layer is a transparent electrode layer; the liquid crystal layer is disposed between the cover glass layer and the second base substrate; and the cover glass layer, the liquid crystal layer, the liquid crystal control electrode, and the second base substrate form the liquid crystal unit.

9. The display panel according to claim 2, wherein the liquid crystal control electrode is integrally distributed on the second base substrate.

10. The display panel according to claim 1, wherein the second display area includes an electrochromic (EC) unit.

11. The display panel according to claim 10, wherein the first display area also includes the EC unit; and the EC unit is disposed on a side of the active emitting display unit opposite to the light emitting side.

12. The display panel according to claim 11, wherein the EC unit of the first display area and the EC unit of the second display area are continuously arranged; and EC units of adjacent sub-pixel units are continuously arranged.

13. A display method of a display panel, wherein the display panel includes the display panel according to claim 1; and the display method comprises:
controlling the second display area to be in the transparent state; and
controlling the active emitting display unit to perform first-mode display; or
controlling the second display area to be in the opaque state; and
controlling the active emitting display unit to perform second-mode display.

14. A method for manufacturing a display panel, comprising:
dividing each sub-pixel unit of a plurality of sub-pixel units into a first display area and a second display area; and
forming an active emitting display unit in the first display area, and configuring the second display area as being switchable between a transparent state and an opaque state,
wherein the configuring the second display area as being switchable between the transparent state and the opaque state includes forming a liquid crystal unit in the first display area and the second display area, wherein the active emitting display unit has a light emitting side,
wherein the display panel comprises:
a first base substrate;
a second base substrate;
a liquid crystal control electrode disposed on the second base substrate; and
a liquid crystal layer disposed between the first base substrate and the second base substrate, wherein the liquid crystal control electrode is disposed on a side of the second base substrate close to the liquid crystal layer,
wherein the active emitting display unit includes a thin-film transistor (TFT) layer, an insulating layer, an anode layer, an organic emission layer, a cathode layer and a cover glass layer which are superimposed on the first base substrate in sequence, the cathode layer is a transparent electrode layer; the insulating layer, the organic emission layer, and the cover glass layer are also disposed in the second display area, and the insulating layer and the organic emission layer each are distributed on the entire first base substrate.

15. The method for manufacturing the display panel according to claim 14, wherein the liquid crystal unit is disposed on a side of the active emitting display unit opposite to the light emitting side in the first display area.

* * * * *